United States Patent
Okahara et al.

(10) Patent No.: US 7,180,272 B2
(45) Date of Patent: Feb. 20, 2007

(54) MALFUNCTION DETECTING APPARATUS FOR ON-VEHICLE CHARGING SYSTEM

(75) Inventors: Hideto Okahara, Kariya (JP); Tadatoshi Asada, Anjo (JP); Fuyuki Maehara, Nagoya (JP)

(73) Assignee: Denso Corporation, Kariya (JP)

( * ) Notice: Subject to any disclaimer, the term of this patent is extended or adjusted under 35 U.S.C. 154(b) by 132 days.

(21) Appl. No.: 11/105,467

(22) Filed: Apr. 14, 2005

(65) Prior Publication Data
US 2005/0242784 A1 Nov. 3, 2005

(30) Foreign Application Priority Data
Apr. 14, 2004 (JP) ............................. 2004-118818

(51) Int. Cl.
*H02J 7/14* (2006.01)
(52) U.S. Cl. ............................. 322/37; 320/123; 322/28
(58) Field of Classification Search ................ 320/123, 320/136; 322/7, 28, 37, 99
See application file for complete search history.

(56) References Cited

U.S. PATENT DOCUMENTS

| | | | | |
|---|---|---|---|---|
| 4,316,134 A | * | 2/1982 | Balan et al. ................... | 322/99 |
| 4,348,629 A | * | 9/1982 | Sievers ......................... | 322/99 |
| 4,360,772 A | * | 11/1982 | Voss ............................. | 322/28 |
| 4,412,169 A | * | 10/1983 | Dell'Orto ................... | 320/123 |
| 4,583,036 A | * | 4/1986 | Morishita et al. ............ | 320/136 |
| 4,670,705 A | * | 6/1987 | Sievers et al. ................ | 322/28 |
| 5,151,647 A | * | 9/1992 | Frantz .......................... | 322/99 |
| 5,481,176 A | * | 1/1996 | DeBiasi et al. ................ | 322/7 |
| 5,617,011 A | * | 4/1997 | Hammer et al. .............. | 322/28 |
| 5,637,985 A | * | 6/1997 | Kakizaki et al. .............. | 322/28 |
| 5,929,609 A | * | 7/1999 | Joy et al. ...................... | 322/25 |
| 6,194,877 B1 | * | 2/2001 | Judge et al. ................... | 322/28 |
| 6,469,475 B2 | | 10/2002 | Pawlik | |

FOREIGN PATENT DOCUMENTS

| | | |
|---|---|---|
| DE | 197 22 267 A1 | 12/1998 |
| DE | 101 06 240 A1 | 12/2005 |
| JP | A-08-079981 | 3/1996 |
| JP | A-2002-027796 | 1/2002 |

* cited by examiner

*Primary Examiner*—Nicholas Ponomarenko
(74) *Attorney, Agent, or Firm*—Oliff & Berridge PLC

(57) ABSTRACT

An apparatus is provided for detecting a malfunction in an on-vehicle charging system provided with a generator driven by an engine and a battery connected with the generator via a charging line. The apparatus comprises a first control unit controlling a generated condition of the generator and including a first voltage detector detecting a voltage generated by the generator and a second control unit including a second voltage detector detecting a voltage across the battery. The apparatus further comprises a communication device communicating, in the form of digital signals, via a communication line between the first and second control units, information about both the generated voltage and the battery voltage and a malfunction determination unit determining whether or not a malfunction occurs in the charging system on the basis of the communicated information.

15 Claims, 7 Drawing Sheets

MALFUNCTION DETECTING APPARATUS FOR ON-VEHICLE CHARGING SYSTEM

CROSS-REFERENCE TO RELATED APPLICATION

The present application claims the benefit of earlier Japanese Patent Application No. 2004-118818 filed Apr. 14, 2004, the description of which is incorporated herein by reference.

BACKGROUND OF THE INVENTION

1. Field of the Invention

The present invention relates to a malfunction detecting apparatus for on-vehicle charging systems, which ensures accurate detection as to whether or not a charging line from a generator to a battery on a vehicle has come off from the generator.

2. Description of Related Art

In general, detecting the disconnection of a charging line connecting a generator and a battery on a vehicle is one of the significant items for vehicle control. Concerning this detection, some methods have already been provided. For example, such a method is known for a system having a sensing line for detecting battery voltage, wherein battery voltage and generator voltage are compared. When the battery voltage is much lower than the generator voltage, it is determined that the charging line has come off (or slipped off or put out of the connection). However, a current mainstream trend is to use a system wherein wiring such as a sensing line is not employed. In such a system, the above method that requires the sensing line is not applicable.

For a system having no sensing line, a method is known, as disclosed in Japanese Published Unexamined Application No. 2002-027796, wherein a ripple waveform of an on-vehicle generator is used to detect the coming-off condition of a charging line.

Further, for a system in which voltage to be generated is controlled by a regulator in response to a voltage command transmitted from an engine ECU (electronic control unit), a method disclosed in Japanese Published Unexamined Application No. H08-079981 is known. With this method, battery voltage detected by the engine ECU is compared with a command value for generation. And, when a difference between the battery voltage and the command value is more than a threshold, the generator is determined as being in failure.

The method disclosed in Japanese Published Unexamined Application No. 2002-027796 set forth above, however, has a difficulty in determining between malfunction and normal function at the time of high loading when ripples are large in a normal state (i.e. a state where a charging line has not come off, or at the time of low loading when ripples are small in a malfunction state. Such a difficulty is problematic in performing accurate detection.

The method disclosed in Japanese Published Unexamined Application No. 08-079981 set forth above enables detection of any malfunction that a generator is involved in. However, the problem is that it is difficult to determine with this method whether the malfunction is caused by the failure of the generator or simply caused by the coming-off of a charging line.

SUMMARY OF THE INVENTION

The present invention has been made under the circumstances described above, and has as its object to provide an apparatus for detecting malfunction in an on-vehicle charging system, which ensures accurate detection of the coming-off of a charging line connecting a generator and a battery.

In order to achieve the above object, the present invention provides an apparatus for detecting a malfunction in an on-vehicle charging system provided with a generator driven by an on-vehicle engine and an on-vehicle battery connected with the generator via a charging line so that the battery is charged with power from the generator, the apparatus comprising: a first control unit controlling a generated condition of the generator and including a first voltage detector detecting a voltage generated by the generator; a second control unit including a second voltage detector detecting a voltage across the battery; a communication line connecting the first and second control units; a communication device communicating, in a form of a digital signal, via the communication line between the first and second control units, information about both the generated voltage detected by the first voltage detector and the battery voltage detected by the second voltage detector; and a malfunction determination unit determining whether or not a malfunction occurs in the charging system on the basis of the communicated information.

According to the arrangement described above, generator voltage or battery voltage is transmitted and received through a communication line, so that the arrangement is applicable to a system having no sensing line for battery voltage. Further, in this arrangement, detection of the presence of any malfunction in an on-vehicle charging system is performed by comparing generator voltage and battery voltage, whereby accurate detection is enabled, irrespective of what kinds or how many or how much electric load(s) are mounted on the vehicle.

The comparison between generator voltage and battery voltage may also enable very accurate detection as to whether or not a generator is in failure, or a charging line simply comes off.

DETAILED DESCRIPTION OF THE PREFERRED EMBODIMENTS

The best modes for implementing the present invention will now described in detail hereinafter through embodiments provided below.

(First Embodiment)

Figure 1:
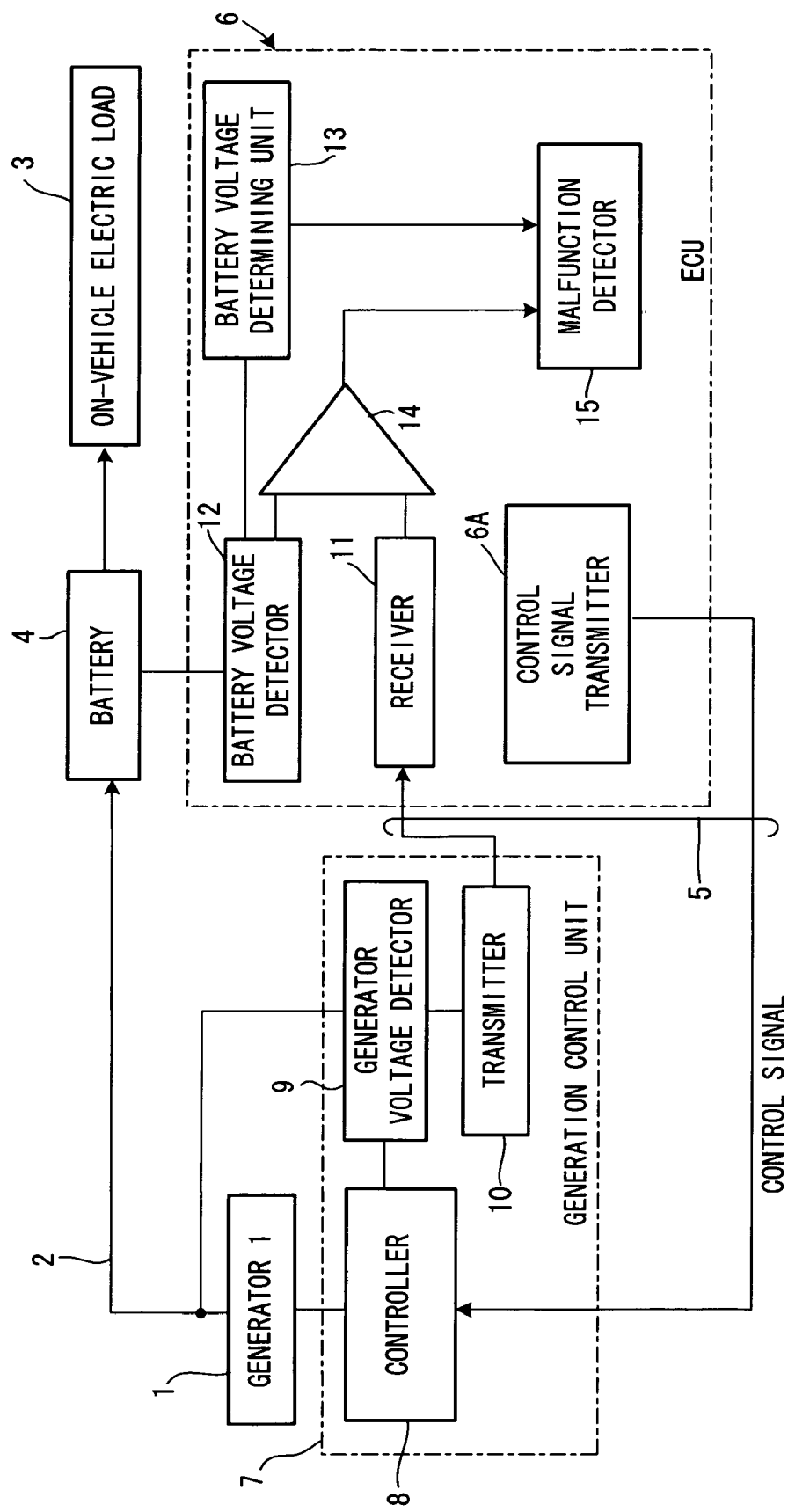
FIG. 1 is a block diagram illustrating an arrangement of a malfunction detecting system according to a first embodiment of the present embodiment.

FIG. 1 is a block diagram illustrating an arrangement of a malfunction detecting system for an on-vehicle charging system.

The on-vehicle charging system according to a first embodiment comprises a generator 1 which generates electric power, being driven by an internal-combustion engine (not shown), a battery 4 which is charged by the generator 1 through a charging line 2 to supply power to an on-vehicle electric load 3 of a vehicle, and a generation control unit 7 which is connected to an external control unit (hereinafter referred to as an ECU (electronic control unit) 6).

The generator 1 is a typical three-phase AC generator in which field winding (not shown) receives a generated rotating magnetic field to allow armature winding (not shown) to generate AC current, and the resultant AC voltage is subjected to full-wave rectification to charge the battery 4.

The generation control unit 7 comprises: a controller 8 for controlling generating conditions of the generator 1 in response to a control signal (voltage command) transmitted from the ECU 6; a generator voltage detector 9 for detecting generator voltage VO of the generator 1 as an analogue value; and a transmitter 10 for converting the detected generator voltage VO into a digital signal for transmission to the ECU 6. The ECU 6 comprises a control signal transmitter 6A to collect various pieces of vehicle information and to produce and transmit, to the generation control unit 7, a control signal indicative of a command for desired voltage to be generated by the generator 1. The ECU 6, which has a CPU and memories (not shown), functionally establishes the control signal transmitter 6A through software processing carried out by the CPU.

The controller 8 intermittently controls a field current that flows in a field winding of the generator 1, so that a generator voltage VO of the generator 1 is adjusted in a controlled manner, corresponding to the voltage command.

The ECU 6 comprises: a receiver 11 for receiving the generator voltage VO (digital signal) transmitted from the control unit 7 for conversion into an analogue value; a battery voltage detector 12 for detecting voltage generated by the battery 4 (i.e., battery voltage VB); a determining unit 13 for determining whether or not the battery voltage VB has been reduced to below a predetermined value; a comparator 14 for comparing the battery voltage VB and the generated voltage VO; and a malfunction detector 15 for detecting the presence of any malfunction in a charging system based on the results obtained from the determining unit 13 and the comparator 14.

Referring now to a flowchart shown in FIG. 2, a procedure for detecting malfunction of an on-vehicle charging system will be described.

In the control unit 7, the voltage VO (generator voltage) generated by the generator 1 is detected as an analogue value by the generator voltage detector 9 (step 10). The detected generator voltage VO is converted into a corresponding digital voltage signal, which is then transmitted to the ECU 6 from the transmitter 10 through the communication line 5 (step 20).

In the ECU 6, steps 30 to 90 as described below are executed. The voltage signal transmitted from the generation control unit 7 is received by the receiver 11 and converted into a corresponding analog generator voltage VO (step 30).

The battery voltage detector 9 then detects the battery voltage VB as an analogue value (step 40) to compare the battery voltage VB with the generator voltage VO (step 50).

When the generator voltage VO is higher than the battery voltage VB, the malfunction detector 15 makes a determination that "the charging line 2 has come off" (step 60). Specifically, when the charging line 2 has come off, no charging is performed from the generator 1 to the battery 4. Thus, the battery voltage VB is gradually reduced while performing discharging to the current consumer 3. When the generator 1 is not in failure at this time, the generator voltage VO of the generator 1 should be maintained at a certain level by the control unit 7, irrespective of the coupling conditions of the charging line 2. Accordingly, when the generator voltage VO is lower than the battery voltage VB, a determination can be made that "the charging line has come off."

In step 50, when the battery voltage VB and the generator voltage VO are approximately equal, then the determining unit 13 determines whether or not the battery voltage VB is below a predetermined value (step 70). In case the battery voltage VB is lower than the predetermined value, i.e. in case the battery voltage VB and the generator voltage VO are approximately the same and both of them are lower than the predetermined value, the malfunction detector 15 determines that "the generator 1 is in failure" (step 80). In other words, in case the generator 1, per se, is in failure, both of the generator voltage VO and the battery voltage VB are reduced in the state where the charging line 2 has not come off. Accordingly, when the generator voltage VO and the battery voltage VB are approximately the same and both of them are reduced to below a predetermined value, a determination can be made that "the generator 1 is in failure."

On the other hand, in case the battery voltage VB is higher than a predetermined value, i.e. in case the battery voltage VB and the generator voltage VO are approximately the same and both of them exceed the predetermined value, no malfunction should be present in the on-vehicle charging system, and thus the malfunction detector 15 determines the system as being "normal" (step 90).

In the flowchart shown of FIG. 2, step 70 for determining whether or not the battery voltage VB is below a predetermined value is executed after step 50 for comparing the battery voltage VB with the generator voltage VO. However, the processing at step 70 may be executed prior to that at step 50. Alternatively, step 50 and step 70 may be concurrently executed.

According to the first embodiment, the generator voltage VO is transmitted from the control unit 7 to the ECU 6 by way of the communication line 5. Thus, without having a sensing line for the battery voltage VB, comparison between the generator voltage VO and the battery voltage VB enables detection of malfunction in an on-vehicle charging system.

As described above, the presence of malfunction in an on-vehicle charging system is detected by comparing the generator voltage VO and the battery voltage VB, so that accurate detection can be performed, regardless of what kinds or how many electric loads are mounted on the vehicle.

In addition, the comparison between the generator voltage VO and the battery voltage VB may also enable accurate detection as to whether or not the generator 1 is in failure, or whether or not the charging line 2 simply comes off.

Figure 2:
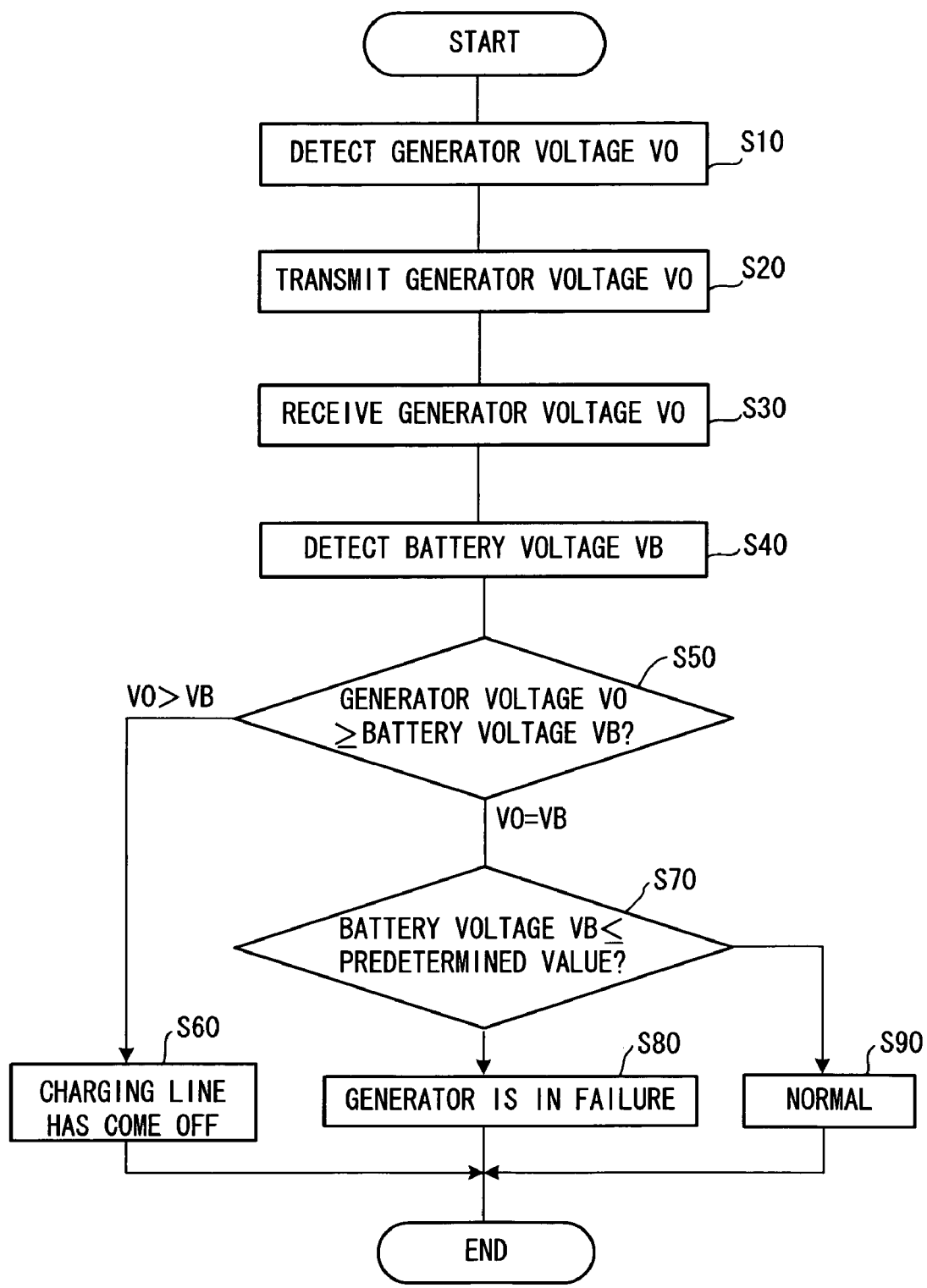
FIG. 2 is a flowchart showing a procedure of malfunction detection of an on-vehicle charging system according to the first embodiment.

Incidentally, the determination processing at step S50 in FIG. 2 is able to include an additional condition that a difference between the generated voltage VB and the battery voltage VB is larger than a given value. This additional condition can be combined with the foregoing condition of VO≧VB. Thus, both the conditions are met, it is concluded that the charging line has come off (has been slipped off) at step S50. This raises noise endurance of the control.

(Second Embodiment)

Figure 3:
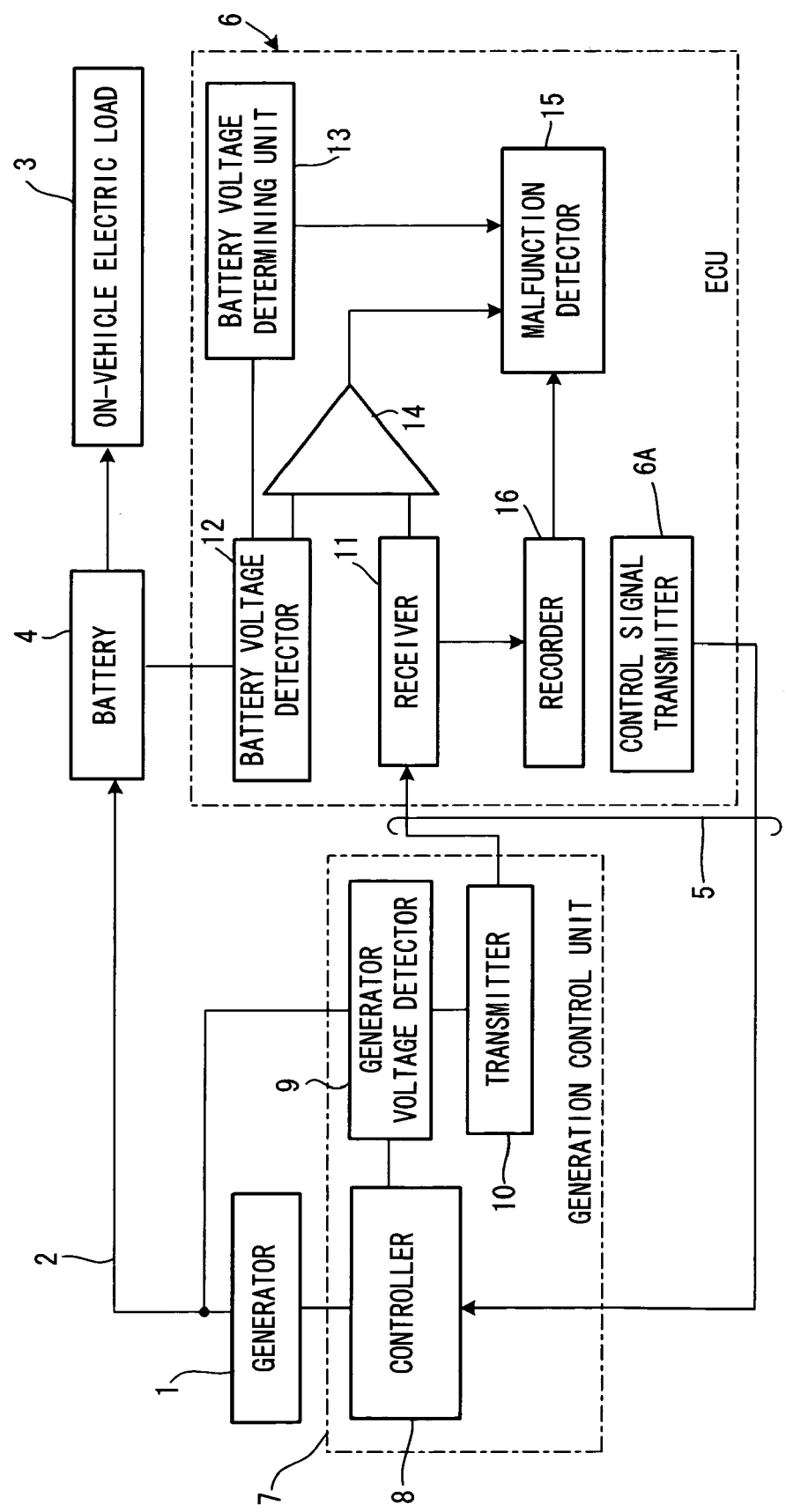
FIG. 3 is a block diagram illustrating an arrangement of a malfunction detecting system according to a second embodiment of the present embodiment.
Figure 4:
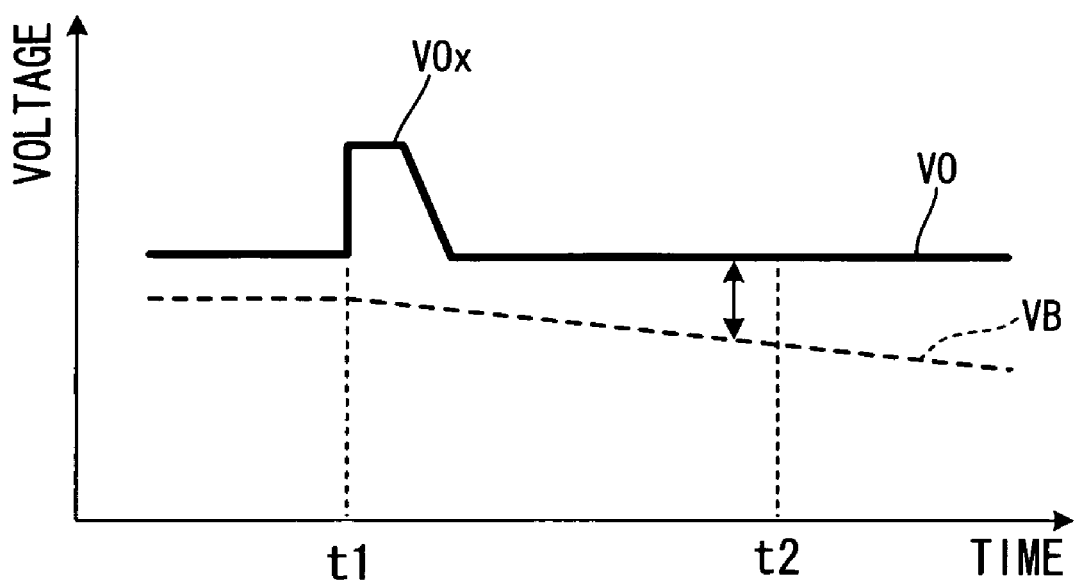
FIG. 4 is a time chart showing battery voltage and generator voltage according to the second embodiment.

Referring to FIGS. 3 and 4, a second embodiment of the present invention will now be described. In the present second embodiment and subsequent embodiments, for the sake of avoiding the explanations from being redundant, the identical or similar components to those shown in the first embodiment are assigned to the same reference numerals as those in the first embodiment.

FIG. 3 is a block diagram illustrating an arrangement of a malfunction detecting system of an on-vehicle charging system.

In the present embodiment, as in the first embodiment, malfunction detection of an on-vehicle charging system is carried out by transmitting the generator voltage VO from the control unit 7 to the ECU 6, and comparing the generator voltage VO with the battery voltage VB in the ECU 6. The present embodiment provides an example of a malfunction detecting system which can particularly detect the "coming-off of a charging line" with an accurate manner.

It is generally known that, once the charging line 2 connecting the generator 1 and the battery 4 has come off, the previously generated current loses a destination to go, and turns into large voltage (spike voltage) to temporarily raise the generator voltage VO of the generator 1. Thus, as shown in FIG. 4, when extremely large generator voltage VOx has been transmitted from the control unit 7 to the ECU 6, the charging line 2 can then be determined, with high probability, as being come off.

To cope with this, in addition to the individual units 11 to 15 described with regard to the first embodiment, the ECU 6 of the present embodiment incorporates therein a recorder 16 which can record the large generator voltage VOx when transmitted from the control unit 7.

The ECU 6 functions such that, when the large generator voltage VOx has been recorded in the recorder 16, the malfunction detector 15 executes detection of malfunction in the charging system based on the results obtained from the determining unit 13 and the comparator 14.

Specifically, as shown in FIG. 4, in case the battery voltage VB is reduced to below a predetermined value and the difference thereof from the generator voltage VO becomes greater than a predetermined value (time t2) after the large generator voltage VOx has been recorded in the recorder 16 at a time t1, then a determination is made that "the charging line has come off." According to this method, determination of the "coming-off of a charging line" is made on the assumption that the large generator voltage VOx has been transmitted from the control unit 7 to the ECU 6. Therefore, detection of the "coming-off of a charging line" can be performed with more accuracy than in the method described with respect to the first embodiment.

(Third Embodiment)

Figure 5:
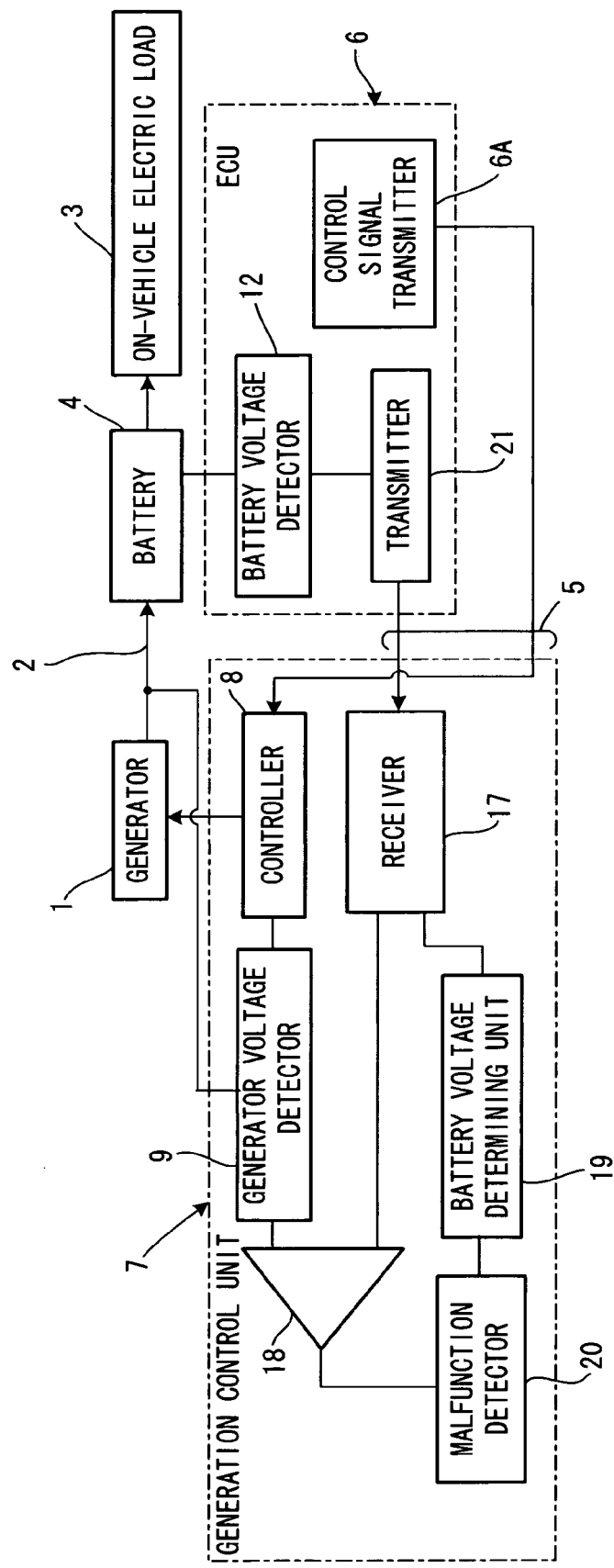
FIG. 5 is a block diagram illustrating an arrangement of a malfunction detecting system according to a third embodiment of the present embodiment.

Referring to FIG. 5, a third embodiment of the present embodiment will now be described.

FIG. 5 is a block diagram illustrating an arrangement of a malfunction detecting system of an on-vehicle charging system.

The present embodiment provides an example in which malfunction detection of an on-vehicle charging system is performed by the control unit 7.

The control unit 7 comprises, other than the controller 8 and the generator voltage detector 9 as described in the first embodiment, a receiver 17 for receiving the battery voltage VB transmitted from the ECU 6, a comparator 18 for comparing the received battery voltage VB and the generator voltage VO, a battery voltage determining unit 19 for determining whether or not the battery voltage VB has been reduced to below a predetermined value, and a malfunction detector 20 for determining malfunction of an on-vehicle charging system based on the results obtained from the comparator and the determining unit 19.

The ECU 6 is provided, other than the battery voltage detector 9 as described in the first embodiment, with a transmitter 21 for converting the battery voltage VB detected by the battery voltage detector 9 into a digital signal for transmission to the control unit 7.

According to the arrangement described above, the battery voltage VB detected in the ECU 6 can be transmitted therefrom to the generation control unit 7 where the battery voltage VB is determined as having been reduced, and at the same time, presence of malfunction in an on-vehicle charging system can be detected based on the results of comparison between the battery voltage VB and the generator voltage VO. Note that a procedure of malfunction detection of the on-vehicle charging system is executed in the same manner as in the procedure of steps 50 to 90 as illustrated in the flowchart of FIG. 2.

(Fourth Embodiment)

Figure 6:
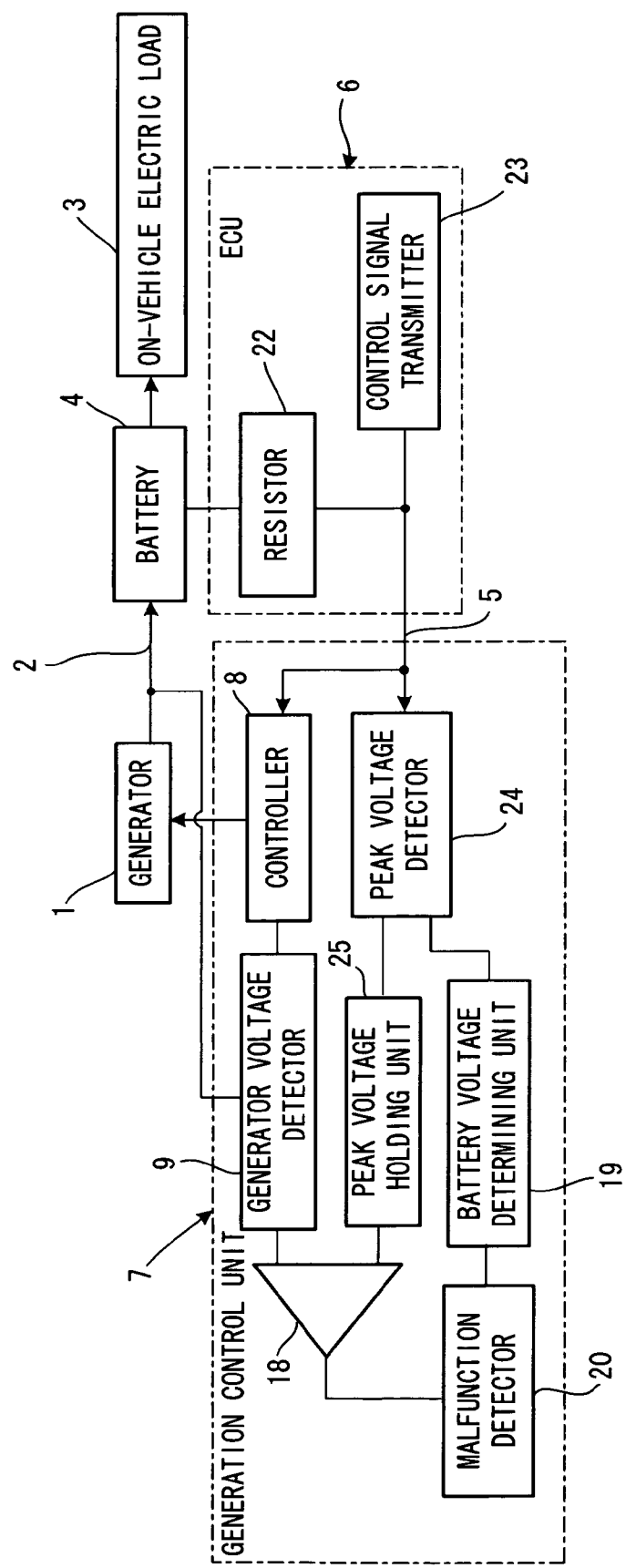
FIG. 6 is a block diagram illustrating an arrangement of a malfunction detecting system according to a fourth embodiment of the present embodiment.
Figure 7:
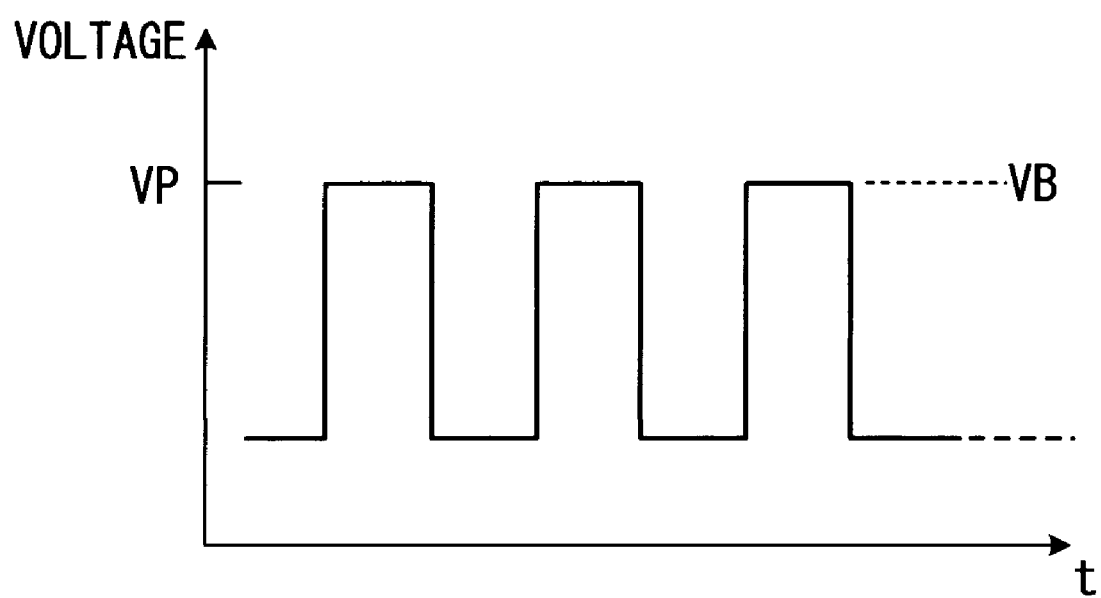
FIG. 7 is a waveform chart showing control signals according to the fourth embodiment.

Referring to FIGS. 6 and 7, a fourth embodiment of the present invention will now be described.

FIG. 6 is a block diagram illustrating an arrangement of a malfunction detecting system of an on-vehicle charging system.

The malfunction detecting system of a fourth embodiment provides a method in which a peak voltage VP (Hi voltage) of a control signal to be transmitted from the ECU 6 to the generation control unit 7 is rendered to be an identical value (see FIG. 7) with the battery voltage VB, and the voltage of the control signal and the generator voltage VO are mutually compared to detect the presence of malfunction in the on-vehicle charging system.

As shown in FIG. 6, the ECU 6 comprises a control signal transmitter 23 which transmits the peak voltage VP (High (Hi) voltage) of a control signal to the generation control unit 7, allowing it to be identical with the battery voltage VB obtained through a resistor 22. The control signal is for example a pulse-width modulated pulse signal depending on operating conditions of a vehicle in which the charging system is mounted.

The generation control unit 7 comprises, as explained in the third embodiment, the controller 8, the generator voltage detector 9, and the comparator 18, the battery voltage determining unit 19 and the malfunction detector 20. The generation control unit 7 also comprises a peak voltage detector 24, instead of the receiver 17, for detecting the peak voltage VP of the control signal transmitted from the ECU 6, and a peak voltage holding unit 25 for holding the detected peak voltage VP.

Determination is made based on the results obtained from the comparator 18, in the similar way to that in the third embodiment. Specifically, when the battery voltage VB is higher than a predetermined value, a determination is made as being "normal", and when the battery voltage VB is lower than the generator voltage VO, it is determined that "the charging line has come off." Further, when the generator voltage VO and the battery voltage VB are approximately the same, and at the same time, when both of the voltages are reduced to below a predetermined value, it is determined that "the generator 1 is in failure".

According to this method, information on the battery voltage VB can be transmitted with a control signal, dispensing with the necessity of separately transmitting a digital signal on the battery voltage VB.

Also, as the peak voltage VP (Hi voltage) of a control signal is equal to the battery voltage VB, superimposition of noises or the like at the time of communication causes no misrecognition of a signal on the battery voltage VB. Thus, the presence of malfunction in an on-vehicle charging system can be accurately detected.

(Modification)

The first to fourth embodiments described heretofore provide examples wherein the generator voltage VO is transmitted from the control unit 7 to the ECU 6, or wherein the battery voltage VB is transmitted from the ECU 6 to the control unit 7. However, other malfunction detecting systems may be provided. By way of example, a transmitter/receiver device is arranged in both the control unit 7 and the ECU 6, so that the generator voltage VO or the battery voltage VB can be transmitted and received between the two units. At the same time, such units as required for malfunction detection in an on-vehicle charging system (including, for example, a comparator for comparing the battery voltage VB and the generator voltage VO, a unit for determining whether or not the battery voltage VB has been reduced to below a predetermined value, and a detector for determining the occurrences of malfunction in the on-vehicle charging system based on the results obtained from the comparator and the determination unit) may be arranged in both of the ECU 6 and the control unit 7.

As described, the foregoing various embodiments provides a variety of features, of which typical ones will be listed below.

For example, it is generally known that, when a charging line connecting a generator and a battery comes off, a generated current that has been flowing from the generator to the battery loses a destination to go, and turns into large voltage (spike voltage) to temporarily increase the generator voltage. When this extremely large voltage is transferred from a generator control unit to an external control unit through a communication line, it is anticipated that some malfunction (particularly, coming-off of a charging line) has occurred. Thus, in case high voltage exceeding a predetermined value is transferred from a generator control unit to an external control unit, the subsequent comparison of the generator voltage and the battery voltage may provide much more accurate detection as to the presence of any malfunction in the on-vehicle charging system.

Thus, a peak voltage (Hi voltage) of a control signal transmitted from an external control unit to a generator control unit is rendered to be the same value as the battery voltage, so that information on the battery voltage can be transmitted with the control signal. As a result, the information (digital signal) on the battery voltage is no longer necessary to be separately transmitted from the control signal. At the same time, the generator control unit no longer is required to equip a receiver for receiving digital signals on the battery voltage. Thus, the malfunction detector can be structured at low cost.

Since the Hi voltage of the control signal equals to the battery voltage, the signals on the battery voltage cannot be misrecognized when superimposed such as by noises at the time of communication, and thus the presence of malfunction in the on-vehicle charging system can be precisely detected.

When a charging line comes off, charging is no longer performed from the generator to a battery, and thus battery voltage is gradually reduced by performing discharging to a current consumer (i.e., on-vehicle electric loads). The generator, if not in failure, is allowed to have a voltage maintained at a certain level by a generator control unit, irrespective of the connecting conditions of the charging line. Accordingly, on condition that the generator voltage is lower than the battery voltage and that the difference between the two voltages is more than a predetermined value, it can be determined that "the charging line has come off."

For example, when a generator, per se, is in failure, both of generator voltage and battery voltage should be reduced. Accordingly, on condition that generator voltage and battery voltage approximately have the same value, and that both of the voltages are lower than a normal voltage (e.g. regulated voltage), it can be determined that "the generator is in failure."

Without the occurrences of any malfunction (such as failure of a generator, or coming-off of a charging line) in an on-vehicle charging system, generator voltage and battery voltage should be at approximately the same level, and both of the voltages can be maintained at a normal voltage (e.g. regulated voltage). The system may then be determined as being "in normal."

The present invention may be embodied in several other forms without departing from the spirit thereof. The present embodiments and modifications as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An apparatus for detecting a malfunction in an on-vehicle charging system provided with a generator driven by an on-vehicle engine and an on-vehicle battery connected with the generator via a charging line so that the battery is charged with power from the generator, the apparatus comprising:

a first control unit controlling a generated condition of the generator and including a first voltage detector detecting a voltage generated by the generator;

a second control unit including a second voltage detector detecting a voltage across the battery;

a communication line connecting the first and second control units;

a communication device communicating, in a form of a digital signal, via the communication line between the first and second control units, information about both the generated voltage detected by the first voltage detector and the battery voltage detected by the second voltage detector; and a malfunction determination unit determining whether or not a malfunction occurs in the charging system on the basis of the communicated information.

2. The apparatus according to claim 1, wherein the communication device is configured to allow information about the generated voltage detected by the first voltage detector to be transmitted from the first control unit to the second control unit.

3. The apparatus according to claim 2, wherein the malfunction determination unit is arranged in the second control unit.

4. The apparatus according to claim 1, wherein the communication device is configured to allow information about the battery voltage detected by the second voltage detector to be transmitted from the second control unit to the first control unit.

5. The apparatus according to claim 4, wherein the malfunction determination unit is arranged in the first control unit.

6. The apparatus according to claim 1, wherein the malfunction determination unit is configured to make a comparison between the generated voltage detected by the first voltage detector and the battery voltage detected by the second voltage detector to determine whether or not the malfunction occurs in the charging system.

7. The apparatus according to claim 1, wherein
the second control unit has a circuit producing a command for a desired voltage and transmitting the command to the first control unit via the communication line and
the first control unit has a controller to control a generated condition of the generator in response to the transmitted command.

8. The apparatus according to claim 2, wherein the second control unit further comprises
a unit determining whether or not the generated voltage transmitted from the second control unit is over a predetermined voltage; and
a recorder recording the generated voltage when the generated voltage is over the predetermined voltage,
wherein the malfunction determination unit is configured to make a comparison between the generated voltage and the battery voltage to determine whether or not the malfunction occurs in the charging system in cases where the recorder records the generated voltage therein.

9. The apparatus according to claim 7, wherein the communication device is configured to allow information about the battery voltage detected by the second voltage detector to be transmitted from the second control unit to the first control unit.

10. The apparatus according to claim 9, wherein the malfunction determination unit is arranged in the first control unit.

11. The apparatus according to claim 10, wherein the second control unit further comprises a control signal transmitter transmitting the control signal to the first control unit, a peak value of the control signal being equal in amplitude to the battery voltage so that information about the battery voltage is superposed on the control signal,
wherein the malfunction determination unit is configured to make a comparison between the peak value of the control signal transmitted from the second control unit and the generated voltage to determine whether or not the malfunction occurs in the charging system in cases where the recorder records the generated voltage therein.

12. The apparatus according to claim 6, wherein the malfunction determination unit includes first means determining whether or not the battery voltage is lower than the generated voltage and second means determining that the charging line has come off when the first means determines that the battery voltage is lower than the generated voltage.

13. The apparatus according to claim 6, wherein the malfunction determination unit includes first means determining whether or not the battery voltage is lower than the generated voltage and a difference between the battery and generated voltages is larger than a given value and second means determining that the charging line comes off when the first means determines that the battery voltage is lower than the generated voltage and the difference between the battery and generated voltages is larger than the given value.

14. The apparatus according to claim 6, wherein the malfunction determination unit includes first means determining whether or not the generated and battery voltages are substantially equal to each other and are lower than a normal value and second means determining that the generator is in failure when the generated and battery voltages are substantially equal to each other and are lower than the normal value.

15. The apparatus according to claim 6, wherein the malfunction determination unit includes first means determining whether or not the generated and battery voltages are substantially equal to each other and are lower than a normal value and second means determining that the generator is in normal operation when the generated and battery voltages are substantially equal to each other and are kept the normal value.

* * * * *